(12) United States Patent
Pehlke

(10) Patent No.: US 6,300,830 B1
(45) Date of Patent: Oct. 9, 2001

(54) MULTIPLEXED INPUT ENVELOPE RESTORATION SCHEME FOR LINEAR HIGH-EFFICIENCY POWER AMPLIFICATION

(75) Inventor: David R. Pehlke, Chapel Hill, NC (US)

(73) Assignee: Ericsson INC, Research Triangle Park, NC (US)

( * ) Notice: Subject to any disclaimer, the term of this patent is extended or adjusted under 35 U.S.C. 154(b) by 0 days.

(21) Appl. No.: 09/752,415

(22) Filed: Dec. 29, 2000

(51) Int. Cl.$^7$ .................................................... H03F 3/217
(52) U.S. Cl. ................. 330/251; 330/207 A; 330/298; 327/407
(58) Field of Search .............................. 330/10, 207 A, 330/207 P, 251, 298; 327/407, 408

(56) References Cited

U.S. PATENT DOCUMENTS

| | | |
|---|---|---|
| 4,717,884 | 1/1988 | Mitzlaff . |
| 5,118,997 | * 6/1992 | El-Hamamsy ................ 315/248 |
| 5,126,684 | * 6/1992 | Solomon ........................ 330/10 |
| 5,329,259 | 7/1994 | Stengel et al. . |
| 5,332,977 | * 7/1994 | Fritsche et al. ............... 330/297 |
| 5,382,915 | * 1/1995 | Muri et al. ..................... 330/10 |
| 5,467,055 | 11/1995 | Wray et al. . |
| 5,872,489 | * 2/1999 | Chang et al. ................ 331/179 |

OTHER PUBLICATIONS

Cox, D. C. "Linear Amplification with Nonlinear Components". *IEEE Transactions on Communications*, Dec. 1974, np.

Sundström, L. et al. "Effect of Modulation Scheme on LINC Transmitter Power Efficiency", *Electronics Letters* Sep. 29, 1994, vol. 30, No. 20, pp. 1643–1645.

Bateman, Andrew et al. "Implementation of the LING Transmitter Using the Combined Analogue Locked Loop Universal Modulator (CALLUM)". *Mobile and Personal Communications* Dec. 13–15, 1993, Conference Publication No. 387, pp. 31–37, ©IEE 1993.

(List continued on next page.)

*Primary Examiner*—Robert Pascal
*Assistant Examiner*—Henry Choe
(74) *Attorney, Agent, or Firm*—Coats & Bennett

(57) ABSTRACT

A circuit for providing a multiplexed input to an amplifier load matching network. The circuit includes a control device receiving amplitude information and phase information from a primary waveform, a plurality of switching devices in communication with the control device and the amplifier, wherein each of the switching devices has a different "ON" resistance. The control device uses the amplitude information to select an active switching device and to control the device using phase information to create a secondary waveform for input to the load matching network. In this way, an amplitude modulated waveform is amplified at high efficiency, enabling application of either all or part of the phase and/or amplitude modulation at the input of the amplifier.

15 Claims, 4 Drawing Sheets

OTHER PUBLICATIONS

Kahn, Leonard. "Single–Sideband Transmission by Envelope Elimination and Restoration". *Proceedings of the IRE*, Jan. 16, 1952, pp. 803–806.

Raab, Frederick H. "Intermodulation Distortion in Kahn–Technique Transmitter". *IEEE Transactions on Microwave Theory and Techniques*, vol. 44, No. 12, Dec. 1996, pp. 2273–2278; TP 3.6–1 to 3.6–10. ©IEEE 1998.

Hashjani, Tirdad Sowlati. "Class E Power Amplifiers for Wireless Communications". Thesis submitted for the degree Doctor of Philosophy, Dept. of Electrical and Computer Engineering, Univ. of Toronto, 1996. © Tirdad Sowlati Hashjani, 1996.

Sokal, Nathan O. "Class E–A New Class of High–Efficiency Tuned Single–Ended Switching Power Amplifiers". *IEEE Journal of Solid–State Circuits*, vol. SC–10, No. 3, Jun. 1975, pp.168–176.

Raab, Frederick H. "Idealized Operation of the Class E Tuned Power Amplifier". *IEEE Transactions on Circuits and Systems*, vol. CAS–24, No. 12, Dec. 1977. Submitted as an unpublished manuscript, revised Jul. 1977, pp. 727–735.

Zulinski, Robert E. et al. "Class E Power Amplifiers and Frequency Multipliers with Finite DC–Feed Inductance". *IEEE Transactions on Circuits and Systems*, vol. CAS–34, No. 9, Sep. 1987, pp. 1074–1087.

Raab, Frederick H. "Effects of Circuit Variations on the Class *E* Tuned Power Amplifier". *IEEE Journal of Solid-State Circuits*, vol. SC–13, No. 2, Apr. 1978, pp. 239–244f.

Vidkjaer, Jens. "A Computerized Study of the Class–*C*–Biased RF–Power Amplifier". *IEEE Journal of Solid–State Circuits*, vol. SC–13, No. 2, Apr. 1978, pp. 247ff.

\* cited by examiner

MULTIPLEXED INPUT ENVELOPE RESTORATION SCHEME FOR LINEAR HIGH-EFFICIENCY POWER AMPLIFICATION

BACKGROUND OF THE INVENTION

The present invention relates to power amplifiers. In particular, the invention relates to a system and apparatus utilizing a multiplexed input modulation scheme for linear high efficiency power amplification.

The present invention also relates to efficient amplification of signals whose envelope is amplitude modulated, and specifically the application of linear amplification at RF frequencies of such signals up to high power levels. In applications that are constrained by limited available DC power (say from a fixed capacity battery power supply), there is a challenge to tailor the waveforms present at the active device output (at any given stage along the chain of amplification) such that power is not dissipated within the active device and is retained for the conversion from DC to RF signal energy. The less power dissipated within the active device, the higher the efficiency of the amplifier. Dissipated power within the active device occurs when there is a simulataneous overlap of non-zero voltage and current of the carrier signal at the output terminal of that device. This product of non-zero voltage and current is wasted energy that detracts from the intended output signal power at the carrier frequency and degrades efficiency. Various techniques and amplifier topologies exist which minimize the finite overlap of current and voltage to a varying degree, and these may be applied in combination with the proposed invention for maximum efficiency when finite amplitude modulation is required.

In applications that also require linear amplification of desired signals, the same clipping that enhances efficiency may degrade linearity. The requirement for an amplified replica of the input signal is difficult to achieve if the waveform is "clipped" or distorted.

This distortion affects certain aspects of the input signal more than others. Just as the input signal can be described to have an amplitude modulation and phase modulation, the distortion can be described as a matrix which when multiplied by those amplitude modulation and phase modulation components will yield the resultant amplitude modulation and phase modulation components at the output. For example, $$\begin{bmatrix} AM_o \\ PM_o \end{bmatrix} = \begin{bmatrix} AM_o/AM_i & AM_o/PM_i \\ PM_o/AM_i & PM_o/PM_i \end{bmatrix} \cdot \begin{bmatrix} AM_i \\ PM_i \end{bmatrix}$$

For certain signals which do not contain any amplitude modulation and only carry information through PM information, the only term of significance in this equation is the $PM_o/PM_i$ term. Often the phase changes induced from a purely phase-modulated input signal do not induce large phase distortion even in very nonlinear amplifiers. Accordingly, a very efficient nonlinear power amplifier can be used to amplify the phase-modulated input without significant degradation in the critical phase information.

This is not the case for amplitude-modulated signals, however, wherein a large envelope amplitude can induce significant amplitude distortion as a result of amplifier nonlinearities. Large changes in amplitude at the device input typically cause large changes in the device capacitances and conductances, all of which vary nonlinearly. These nonlinear conductance and capacitance changes result in significant distortion of the waveform seen at the output. This distortion ultimately degrades the ability of the power amplifier to meet the linearity requirements of its application. At the same time, the efficiency benefits of operating an amplifier nonlinearly are significant, and thus the use of nonlinear amplifiers to linearly amplify signals with strong amplitude modulation has been an area of much study.

Established approaches exist to restore the amplitude modulation envelope on the output of a nonlinear amplification stage, which is itself able to achieve a very high efficiency, and therefore the system solution modulating that core amplifier is able to attain high efficiency. Such approaches generally rely on the use of a phase-modulated signal of constant envelope at the amplifier input. The nonlinear amplifier can efficiently amplify the phase modulation component without AM/AM and AM/PM distortion. The amplitude modulation envelope information is then restored at the amplifier output without inducing amplitude distortion at that stage.

One well-known approach for separately amplifying amplitude and phase information is Linear Amplification Using Nonlinear Components (LINC). The technique utilizes a pair of amplifier chains, each operating on constant-envelope signals whose relative phase is varied such that their sum results in a desired envelope having varying amplitude. The power combining of the two chains at their output sums the coherent parts of each waveform and places that result on the output. The destructive interference between the two signals is dissipated in the termination resistor of the power combining element. This dissipation can significantly degrade the efficiency of the overall amplifier, especially when the two signals are significantly out of phase in order to reach a minimum desired output amplitude.

Envelope Elimination and Restoration (EER), or Kahn-technique transmission, is also well-known. Like LINC, EER involves the use of a constant envelope phase modulated input signal. EER, however, restores the amplitude modulated envelope information directly on the supply line of the output DC supply. By directly modulating the supply voltage on the output, the resultant waveform consists of the amplified phase information to a saturated level defined by the supply voltage. The output then restores the envelope by becoming the upper and lower limits within which the amplified phase waveform is bracketed. Modulation of the supply voltage can be problematic, however, as the spurious output of the switching regulator can interfere significantly with the desired envelope. Furthermore, to minimize the effect of the switching regulator interference, it must be switched at a high rate and the intermodulation spurs at its output must be filtered down to very low frequency. As a result, if a feedback loop is required in order to correct for amplitude distortion, the bandwidth of that loop is constrained to be extremely small and unusable for wide bandwidth channel communications.

There is therefore a need for an improved envelope restoration scheme that overcomes the limitations of power combining losses in LINC, and the switching regulator limitations in standard EER/Kahn implementations.

BRIEF SUMMARY OF THE INVENTION

In accordance with the present invention, the preferred embodiments described herein provide an apparatus and method for creating a quantized waveform based on received phase and amplitude information from an input signal. In particular, the present invention may be embodied in a circuit comprising a control device that receives amplitude and phase information independently of one another from a primary waveform. A plurality of switching devices, each having a different "ON" resistance are controlled by the control device. The control device uses the amplitude information to select an active switching device. The control device then uses the phase information to control the active switching device to create a secondary waveform for input to an output load matching network of a class E amplifier.

The invention may also be embodied in a method comprising the step of separating amplitude and phase information from a primary waveform. The amplitude and phase information are received independently of one another into a control device. The amplitude information is used to select an active switching device from a plurality of switching devices, each having a different current resistance. The phase information is then used to control the active switching device to create a secondary waveform. Finally, the secondary waveform is provided as an input to an output load matching network of a class E amplifier.

Advantages of the present invention will become readily apparent to those skilled in the art from the following description of the preferred embodiments of the invention which have been shown and described by way of illustration. As will be realized, the invention is capable of other and different embodiments, and its details are capable of modifications in various respects. Accordingly, the drawings and description are to be regarded as illustrative in nature, and not as restrictive.

DETAILED DESCRIPTION OF THE INVENTION

Figure 1:
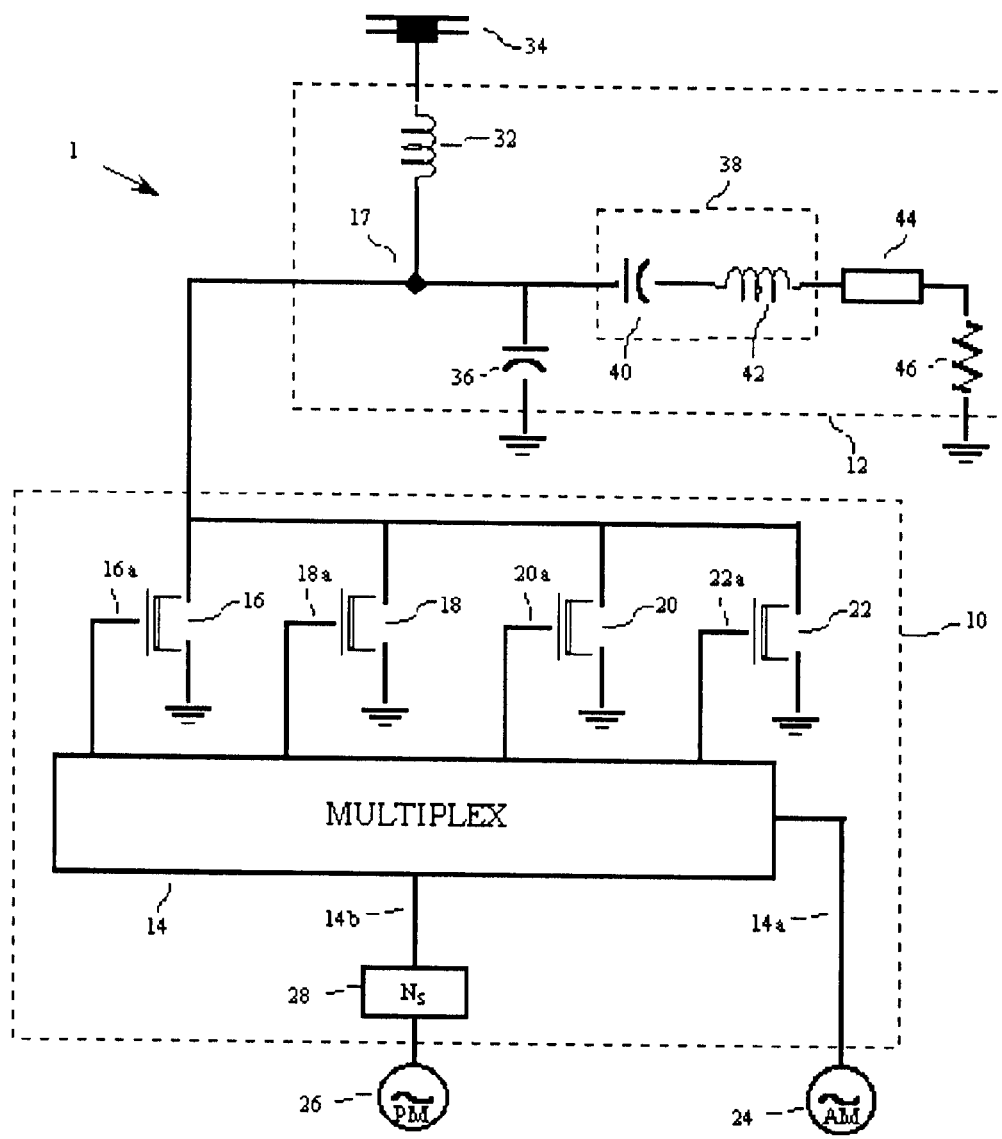
FIG. 1 is a schematic diagram of a circuit implementing the present invention.

Turning now to the drawings, wherein like numeral designate like components, FIG. 1 is a diagram of a active device switching circuit 10 combined with an output load matching network 12 to make up an amplifier 1. The circuit 10 preferably includes a control device 14 and a plurality of switching devices 16, 18, 20, and 22, each having a different current resistance, and a control device 14. The control device is preferably a multiplexer, such as that commonly available from Motorola, Inc. The switching devices should be lower minimum "ON" resistance devices with high-speed switching capabilities, one example would be the 2SK2922 LDMOS RF discrete FET transistor manufactured by Hitachi, Inc. (http://www. hitachi.co.ip/Sicd/English/Products/transise.htm). These devices are exemplary only for this embodiment, and a wide variety of other components or structures may be substituted for the components described in accordance with the knowledge of one skilled in the art.

The embodiment described here is a class E implementation for extremely high efficiency and other listed advantages, although other embodiments for the invention may consist of class C, or other amplifier modes of operation. A standard class E amplifier comprises a single transistor switch and the same output load matching network 12 as shown in the first embodiment of FIG. 1. The connection node 17 between the active switch devices 10 and this standard class E output load matching network 12 comprises an inductance coil 32 connecting to the supply voltage Vdd 34. A capacitance 36 which includes parasitic capacitance from the active device(s) in parallel with the active device output impedance. A tuned circuit filter 38 consisting of a capacitance 40 and an inductance 42 connected in series with a reactive component 44 and a load resistance 46, nominally 50 Ohm. Typically, frequency and phase modulation information is received from the switches at node 17, and amplitude modulation information is received by variation of the supply voltage Vdd at 34. However, in the present case, as will be described below, the amplitude and phase information 24 and 26 are both received as a switched input at inputs 14a and 14b and are utilized by the control device 14 and the plurality of switching devices 16, 18, 20, and 22 to produce a desired signal at node 17, such that the final signal delivered to the load 46 is as desired.

The control device 14 receives amplitude information 24 and phase information 26 from a primary waveform. The phase information 26 and amplitude information 24 are received into inputs 14a and 14b of the control device 14. A matching network 28 is linked to input 14b to provide optimum power transfer from the phase modulated source through the control device 14 to input gates 16a, 18a, 20a, and 22a of the switching devices 16, 18, 20, and 22. The matching network 28 may comprise a number of reactive elements according to known methods. Alternative embodiments may include and/or replace matching network 28 with individual matching networks following the control device 14 for further optimization of the input matching for these different-sized switching devices 16, 18, 20, and 22.

The control device 14 uses the amplitude information 24 to select an active switching device from the plurality of switching devices 16, 18, 20, and 22. The switching devices 16, 18, 20, and 22 are controlled by the control device 14 via inputs 16a, 18a, 20a, and 22a. After selecting an active switching device, the control device 14 uses the phase information 26 to control the active switching device to create a secondary waveform for input to the amplifier load network 12 at node 17.

During operation, the control device 14 controls the active switching devices in accordance with the phase information 26. The control device 14 preferably turns the active switching device off and on in response to the phase information 26. As a result, the switch voltage varies between zero and the peak switch voltage of the active switching device.

Because the switching devices 16, 18, 20, and 22 each have a different "ON" resistance, they each exhibit a different peak switching voltage when activated. The control device 14 selects an active switching device in accordance with the amplitude information 24 to achieve a desired peak switch voltage. By selecting an appropriate active switching device for a given time period, the peak amplitude of the switch voltage may be varied to produce a quantized approximation of the amplitude envelope of the primary waveform. As the voltage across the active switching device varies in response to the phase information 26, it is limited to the peak switch voltage of the particular active switching device selected in accordance with the amplitude information 24. Preferably, the amplitude information 24 and phase information 26 are used to create a secondary waveform that approximates the primary waveform. The secondary waveform is then provided as input to the 12 matching network of the amplifier 1.

Figure 2:
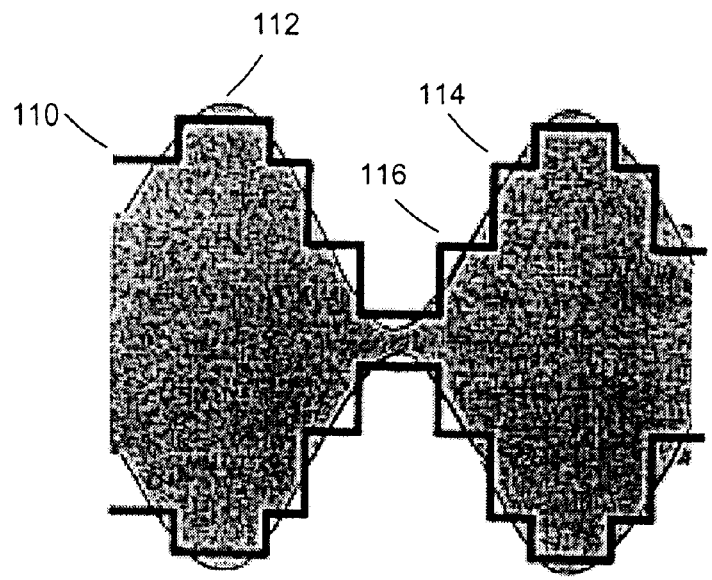
FIG. 2 is a diagram illustrating the quantization of a waveform as produced by the embodiment of FIG. 1.

The selection of an active switching device to achieve peak switch voltage may be accomplished at various rates of change. By varying the rate of change, any spurious noise produced by the switching process may be placed out of band or shaped to meet any given noise specifications. FIG. 2 illustrates a quantized approximation 110 for a slow switching rate. The quantized approximation 110 is quantized at discrete amplitude levels 114 and 116 to approximate the amplitude envelope 112 of the primary waveform.

Lower switching rates on the same order as the amplitude envelope frequency and below incur disadvantages of discrete quantization noise. In order to avoid effects of quantization distortion for slow switching rates, the number of available amplitude levels 114 and 116 may be increased by adding additional switching devices, each having varied current resistances within a determined range. Out-of-band filtering may be required following the load network 12 to reduce the quantization noise to acceptable levels.

Figure 3:
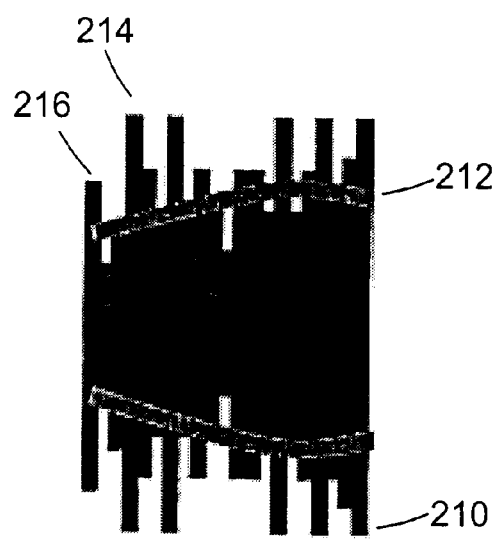
FIG. 3 is a diagram illustrating the quantized waveform of FIG. 2 as output by the embodiment of FIG. 1.

Alternatively, switching at a higher rate, up to the rate of the phase modulation, allows for rapid switching in and out of a variety of amplitudes, filtering out eventually to the desired average value. This modification is illustrated in FIG. 3. As the quantized approximation 210 is switched at a high rate between discrete quantized levels such as 214 and 216, the device filters over a relatively short period of time to generate an average value that approximates the amplitude envelope 212 for that period. A higher switching rate enables a small number of discrete amplitude levels 214 and 216 to be used to achieve any arbitrary amplitude envelope value. This requires fewer switching devices 16, 18, 20 and 22 and results in simpler control device functionality. The control of the switching at this rate is possible with the use of standard high-speed multiplexer circuits that are well-known in the art.

The switching in of higher "ON" resistance active devices will decrease the output amplitude and power, but also the related power-added efficiency of the amplifier. Through the design of the class E device, significant efficiencies can be achieved even for higher "ON" resistance states. Because of this fact, the operation of the device at lower power can result in efficient amplification down to low output powers even for the same fixed power supply voltage. Furthermore, significant gains in efficiency can be achieved with discrete voltage from a switched power supply regulator made active just for lower power levels. The embodiments presented herein allow for changes in the power supply voltage without any need for modifications in the load network.

Figure 4:
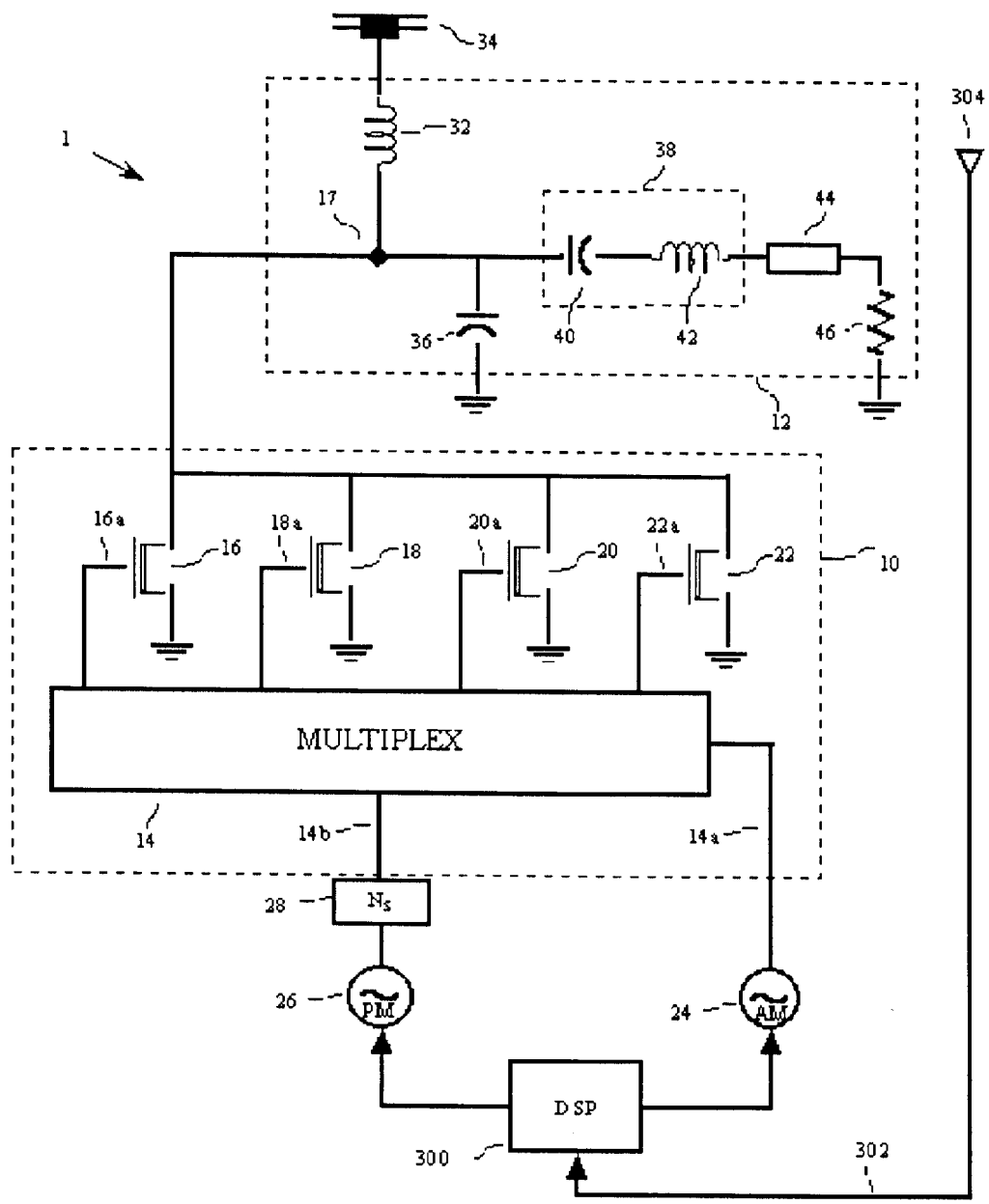
FIG. 4 is a schematic diagram illustrating a modification to the circuit shown in FIG. 1.

In the present embodiment, there is some predistortion required to input the correct waveform to the control device 14 at input 14b to achieve the desired output waveform from the amplifier 1. A unique input waveform for any given desired output may be defined so that a baseband digital signal processor can properly generate the corrected input waveform. A circuit to accomplish this is depicted in FIG. 4, showing a digital signal processor 300 being input into the control device input 14b. This predistortion may be generated by conventional methodology known in the art. In the alternative, an additional feedback loop may be implemented to periodically update the input-to-output relationship in accordance with any long-term degradation requirements. For instance, a feedback loop 302 may be used to sense any voltage standing wave ratio ("VSWR") reflection from the antenna 304. The feedback loop may then control the digital signal processor 300 to adjust the amplitude and phase information 24 and 26 to correct for any VSWR reflection before the amplitude information is received by the control device 14.

The overall phase distortion due to variations in the output supply voltage of switching regulator based EER implementations is alleviated in the present embodiments. This is due to the fact that the parasitic capacitance does not vary with output DC voltage in the active switching device. The output supply remains constant. The addition of switching devices, however, does increase the total "nonlinear" parasitic capacitance required at the input to the loading network, and as such would be susceptible to changes in the average DC value. But in the present embodiments the "average" DC value is maintained at the battery voltage without change.

A significant advantage of this approach is that the modulation can be applied directly from baseband without the need for delivering large DC current directly from the modulating source. The use of baseband to deliver the envelope assures direct software control of the envelope of the amplifier for application of the same saturated amplifier core for different modulation formats and input signals. Improved system-level control of the waveforms is then possible, thereby facilitating complementary schemes used in conjunction with the present embodiment such as phase correction feedback or adaptive predistortion utilizing a digital signal processor as is known in the art.

Additional embodiments of the invention may include the use of some portion of the amplitude modulation on the phase signal 26, and some portion of the phase modulation on the amplitude signal 24 in order to further reduce the bandwidth requirements of those two input signals. When a filtered IQ signal is broken out into separate amplitude and phase components, those amplitude and phase components typically have much larger bandwidth than the original IQ representation. The predistortion of the amplitude signal 24 required for generation of the desired output helps to reduce the bandwidth requirement of the amplitude signal 24, as it reduces the required sharp amplitude cusps that occur during the minmium of typical digital modulation waveform envelopes. Further relaxation of the bandwidth requirements can be achieved using some combination of the amplitude and phase signals on either/both of the input signals 24 and 26.

The class E amplifier topology exhibits the highest optimum load resistance of any of the amplifier topologies, which is especially important as the supply voltage is decreased and other topologies suffer from matching losses and parasitic limitations to peak efficiency. There is the potential for less power lost in impedance transformation to the 50 Ohm filter, duplexer, and antenna interfaces. Moreover, the stability of the switch-based prior art is not an issue in the present embodiments due to the low gain states of the ON and OFF states. This enables the use of lower gate dimension FET technologies for the switches whose higher IDSS enables smaller devices and die sizes, as well as faster switching speeds for high efficiency.

Figure 5:
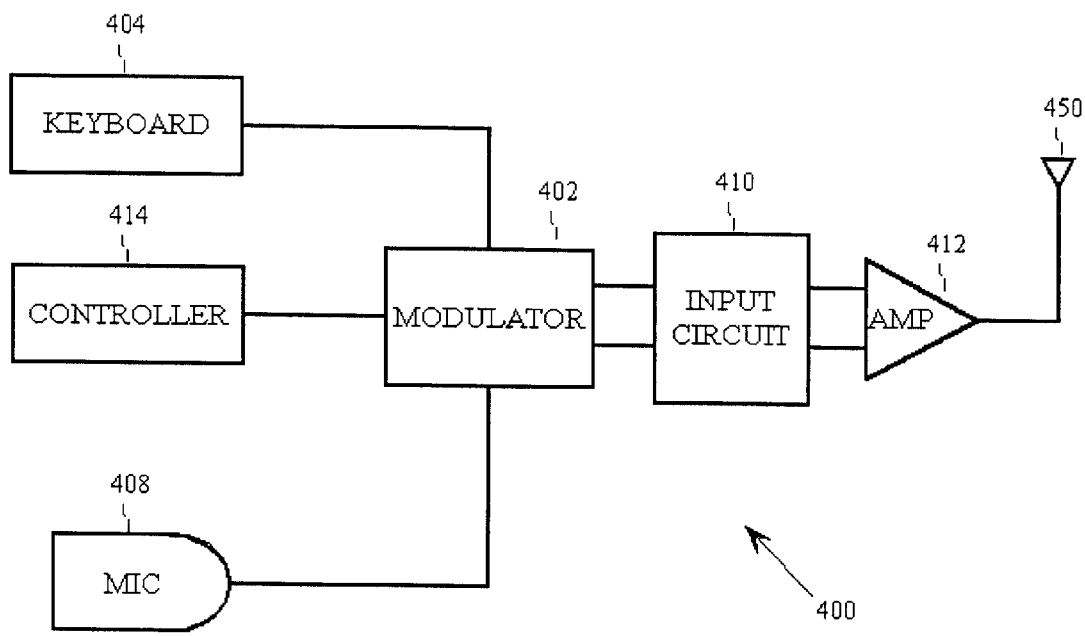
FIG. 5 is a block diagram of a communication device in accordance with the present invention.

Referring now to FIG. 5, a block diagram schematic of a communication device 400 in accordance with the present invention is illustrated. The communication device 400 is preferably a wireless transmitter used for the transmission of modulated signals. A modulator 402 receives voice input from microphone 408 and text input from keyboard 404. The signals from the microphone 408 and keyboard 404 are processed within the modulator 402 to phase modulate a carrier signal using well-known phase modulation techniques. The phase modulated signals are coupled to an input circuit 410 and processed in accordance with the embodiments described above. The resultant output is coupled to a preferably E-class amplifier 412. The output of the amplifier 412 is subsequently coupled to the antenna 450. Control device 414 preferably controls operation of the modulator 402 and the input circuit 410, including the multiplexer as described previously. While only a minimum number of components are shown in the schematic of FIG. 5, one skilled in the art may readily substitute componentry or modify the circuit to provide working alternatives to the system of the present embodiment.

Of course, it should be understood that a wide range of changes and modifications can be made to the preferred embodiments described above. Thus, it is intended that the foregoing detailed description be regarded as illustrative rather than limiting, and that it be understood that it is the following claims, including all equivalents, which are intended to define the scope of this invention.

What is claimed is:

1. An active switching circuit for providing a waveform for input to an output load matching network in a class E amplifier, said circuit comprising:
    a control device receiving amplitude information and phase information from a primary waveform, said amplitude and phase information being received independently from each other; and
    a plurality of switching devices in communication with said control device and said output load matching network, said switching devices each having a different current resistance;
    wherein said control device uses said amplitude information to select an active switching device from said switching devices, and said control device uses said phase information to control said active switching device to create a secondary waveform for input to said matching network.

2. The circuit of claim 1 wherein said secondary waveform is a quantized approximation of said primary waveform.

3. The circuit of claim 1 wherein said control device selects only one active switching device at a time.

4. The circuit of claim 1 wherein said control device selects multiple active switching devices simultaneously.

5. The circuit of claim 1 wherein said switching devices are transistors each having a gate, and said control device controls said active switching device by providing said phase information at said gate of said active switching device.

6. The circuit of claim 1 wherein said control device is a multiplexer.

7. The circuit of claim 1 further comprising a digital signal processing device in communication with said control device, wherein said digital signal processing device adjusts said amplitude information before it is received into said control device to correct for distortion in said amplitude information.

8. The circuit of claim 1 further comprising:
    a digital signal processing device in communication with said control device; and
    a feedback loop for sensing VSWR reflection from an antenna in communication with said amplifier, said feedback loop in communication with said digital signal processing device;
    wherein said digital signal processing device adjusts said amplitude information before it is received into said control device to correct for said VSWR reflection.

9. A method for providing a waveform to an output load matching network in a class E amplifier, said method comprising the steps of:
    separating amplitude information and phase information from a primary waveform;
    receiving said amplitude information and phase information independently into a control device;
    using said amplitude information to select an active switching device from a plurality of switching devices, said switching devices each having a different current resistance;
    using said phase information to control said active switching device to create a secondary waveform; and
    providing said secondary waveform as an input to said matching network.

10. The method of claim 9 wherein said secondary waveform is a quantized approximation of said primary waveform.

11. The method of claim 9 wherein the step of using said amplitude information to select an active switching device further comprises the step of selecting only one active switching device at a time.

12. The method of claim 9 wherein the step of using said amplitude information to select an active switching device further comprises the step of selecting multiple active switching devices simultaneously.

13. The method of claim 9 wherein said switching devices are transistors each having a gate, and said active switching device is controlled by providing said phase information at said gate of said active switching device.

14. The method of claim 9 wherein said control device is a multiplexer.

15. The method of claim 9 further comprising the step of adjusting said amplitude information before it is received into said control device to correct for distortion in said amplitude information.

* * * * *